United States Patent [19]

Irwin

[11] Patent Number: 5,521,936
[45] Date of Patent: May 28, 1996

[54] RADIAL LASER DIODE ARRAY

[75] Inventor: Timothy L. Irwin, Rochester, N.Y.

[73] Assignee: Paradigm Lasers, Inc., East Rochester, N.Y.

[21] Appl. No.: 382,513
[22] Filed: Feb. 1, 1995
[51] Int. Cl.⁶ ..................................................... H01S 3/091
[52] U.S. Cl. .................................. 372/75; 372/38; 372/69
[58] Field of Search .................................. 372/75, 34, 36, 372/70, 69

[56] References Cited

U.S. PATENT DOCUMENTS

| | | | |
|---|---|---|---|
| 3,555,452 | 1/1971 | Nielsen et al. | 372/75 |
| 5,033,058 | 7/1991 | Cabaret et al. | 372/75 |
| 5,216,688 | 6/1993 | Kortz et al. | 372/75 |

Primary Examiner—Leon Scott, Jr.
Attorney, Agent, or Firm—Robert J. Bird

[57] ABSTRACT

A laser device includes a laser rod; a dielectric coolant tube around the laser rod, forming an annular rod coolant channel; a segmented conductive ring around the coolant tube with laser diodes between adjacent ring segments; the ring segments and laser diodes together forming a current path around the ring; and a sleeve around the ring, forming an annular diode coolant channel.

4 Claims, 1 Drawing Sheet

RADIAL LASER DIODE ARRAY

BACKGROUND OF THE INVENTION

1. Technical Field

This invention relates to laser excitation from a surrounding radial array of laser diodes.

2. Background Information and Disclosure under 37 CFR 1.97–1.99

Excitation of a laser rod by means of laser diodes disposed around the laser rod in a radial array is known in the prior art. The most relevant art that I know of is as follows:

U.S. Pat. No. 5,033,058 to Cabaret et al, issued Jul. 16, 1991, discloses a laser rod in a glass tube with a segmented reflective coating. Laser diodes placed around the glass tube emit through windows in the reflective coating to excite the laser rod.

U.S. Pat. No. 5,040,187 to Karpinski, issued Aug. 13, 1991 and U.S. Pat. No. 5,128,951 to Karpinski, issued Jul. 7, 1992 both disclose laser diode bars in parallel grooves in a metallized ceramic mount.

SUMMARY OF THE INVENTION

A laser device according to this invention includes a laser rod; a dielectric coolant tube around the laser rod, forming an annular rod coolant channel; a segmented conductive ring around the coolant tube with laser diodes between adjacent ring segments; the ring segments and laser diodes together forming a current path around the ring; and a sleeve around the ring, forming an annular diode coolant channel.

DRAWINGS

DESCRIPTION OF THE PREFERRED EMBODIMENT

Figure 1:
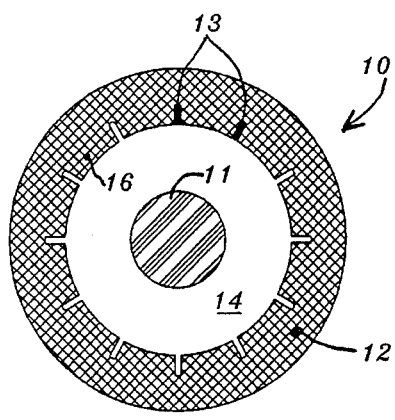
FIG. 1 is a cross-sectional view of a laser rod and laser diode array of the prior art.

FIG. 1 illustrates a prior art laser device, including a laser rod and laser diode array. The Karpinski patents discussed above relate to structure and fabrication of the laser diode array which is part of the device in FIG. 1. The laser device 10 includes a laser rod 11 within a cylinder 12, axially grooved along its interior to support a plurality of laser diodes 13 in a radial array around the laser rod 11. The cylinder 12 is beryllium oxide (BeO) which is electrically non-conductive. The inner surface 16 of the cylinder 12 is metallized for surface electrical conductivity. Voltage across terminals (not shown) energizes the laser diodes 13 which in turn excite the laser rod 11. The space 14 between the laser rod 11 and the cylinder 12 is air space.

Figure 2:
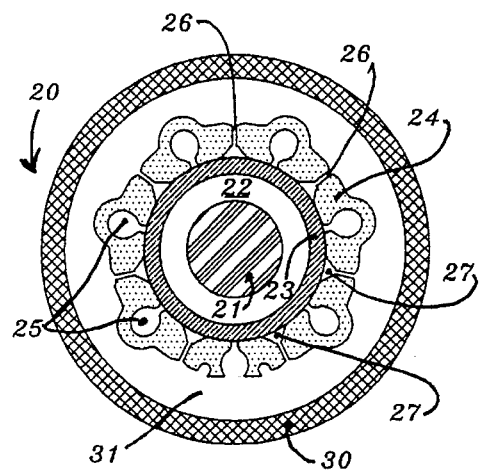
FIGS. 2 and 3 are cross-sectional views of a laser rod and laser diode array of this invention, at progressive stages of construction.

In FIG. 2, the laser device 20 of this invention includes a laser rod 21 within a dielectric coolant tube 23 which forms an annular rod coolant channel 22 around the laser rod 21. Suitable spacers, not shown, hold the laser rod 21 in the center of the coolant tube 23. A conductive ring 24 surrounds the coolant tube 23. An outer sleeve 30 around the conductive ring 24 forms an annular diode coolant channel 31.

The conductive ring 24 is actually a ring of discrete segments 24a–24g, with radial laser diode spaces 26 between them. The inner surface of each ring segment includes a resin channel 25 for bonding agent to bond the segment to the coolant tube 23. The inner end of each radial space 26 is relieved by a chamfer 27, so that adjacent segments together form a cavity for solder.

Figure 3:
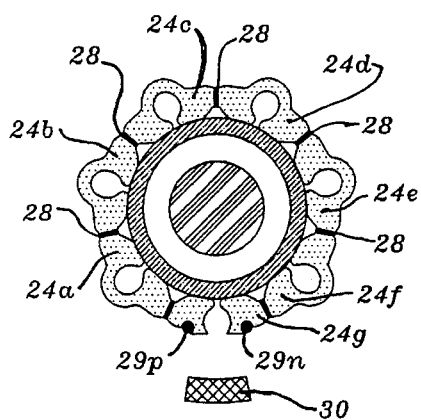

In FIG. 3, the outer sleeve 30 is largely broken away for the sake of clarity. A laser diode 28 is fixed in each radial space 26 by solder introduced into the chamfer spaces 27. One of the conductive ring segments 24g is severed in two parts, and electrically separated. One part supports a positive electric terminal 29p, and the other supports a negative electric terminal 29n. The segments of ring 24, and the laser diodes 28 soldered between them together create an electric current path from terminal 29p to terminal 29n as indicated by the arrows in FIG. 4.

Figure 4:
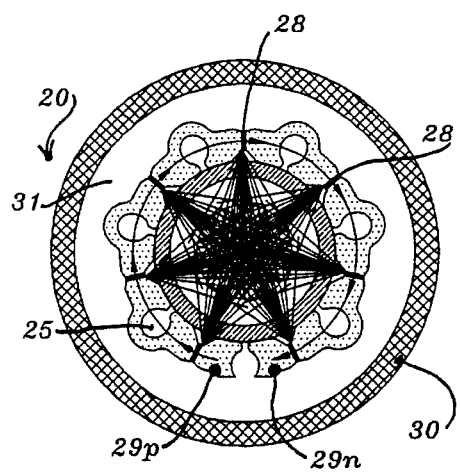
FIG. 4 is similar to FIG. 3, showing the laser diode array in operation.

Voltage across the terminals produces current around the ring 24 to energize the several laser diodes 28. The laser diodes, in turn, energize the laser rod 21. The radial array of laser diodes 28 produces a symmetry of pumping energy in the laser medium, as illustrated in FIG. 4.

The laser device 20 is about the diameter of a typical pencil. Heat is generated in this small body and must be removed to protect both the device and its operability. The rod coolant channel 22 around the laser rod 21 is a conduit for coolant water to carry heat away from the laser rod 21. The conductive ring 24 conducts heat away from the laser diodes 28. The diode coolant channel 31 around the conductive ring 24 is a conduit for coolant water to carry heat away from the ring 24. The conductive ring 24 is a more effective thermal conductor than the beryllium oxide of the prior art. Copper thermal conductivity is 4 watts/cm$^2$ @27° C. (i.e. room temperature). Beryllium oxide thermal conductivity is 3 watts/cm$^2$ @27° C.

In the example shown and described, the laser rod 21 is a neodimium YAG laser, and there are seven each of the ring segments 24, spaces 26, channels 25, and laser diodes 28. The laser diodes each require about two volts for operation, and so with seven laser diodes the applied voltage in this example is approximately 14 volts.

The segmented conductive ring 24 is preferably copper for its thermal and electrical conductivity, but it might be a copper alloy or aluminum. The coolant tube 22 is preferably sapphire, but might be glass or quartz for example. It is essential only that it be dielectric. The outer sleeve 30 might be glass, synthetic resin, ceramic, or metal.

The foregoing description of a preferred embodiment of this invention is intended as illustrative. The concept and scope of the invention are limited only by the following claims and equivalents thereof.

What is claimed is:

1. A laser device including:

a laser rod;

a coolant tube surrounding said laser rod, defining therewith a rod coolant channel;

a plurality of discrete conductive ring segments surrounding said coolant tube, each of said ring segments separated from the next ring segment by a radial laser diode space;

a laser diode in each of said spaces, said ring segments and said laser diodes together forming a series path for electric current around said ring in which each of said laser diodes carries all of said current, and none of said current is shunted around any of said laser diodes; and a sleeve surrounding said ring, defining therewith a diode coolant channel.

2. A laser device including:

a laser rod;

a dielectric coolant tube surrounding said laser rod, defining therewith an annular rod coolant channel;

a segmented conductive ring surrounding said coolant tube, adjacent ring segments defining radial laser diode spaces therebetween, one of said ring segments including electrically separate positive and negative electric terminals for connection to a source of voltage;

a laser diode in each of said spaces;

said ring segments and said laser diodes together forming a series path for electric current around said ring between said terminals in which each of said laser diodes carries all of said current and none of said current is shunted around any of said laser diodes; and a sleeve surrounding said ring, defining therewith an annular diode coolant channel.

3. A laser device as defined in claim 2, in which said segmented conductive ring is composed of metal selected from the group consisting of copper, a copper alloy, and aluminum.

4. A laser device as defined in claim 2:

said ring segments each including a resin channel for resin to bond said ring segment to said coolant tube; and adjacent ring segments together forming a solder cavity therebetween.

* * * * *